(12) United States Patent
Nakagawa et al.

(10) Patent No.: US 6,703,092 B1
(45) Date of Patent: Mar. 9, 2004

(54) RESIN MOLDED ARTICLE FOR CHAMBER LINER

(75) Inventors: Shinichi Nakagawa, Tochigi (JP); Shuji Sakai, Kanagawa (JP)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/674,745

(22) PCT Filed: May 26, 1999

(86) PCT No.: PCT/US99/11554

§ 371 (c)(1),
(2), (4) Date: Nov. 2, 2000

(87) PCT Pub. No.: WO99/63584

PCT Pub. Date: Dec. 9, 1999

(30) Foreign Application Priority Data

May 29, 1998 (JP) ............................................ 10-150137

(51) Int. Cl.$^7$ ............................................... B29D 23/00
(52) U.S. Cl. ................... 428/35.7; 428/473.5; 428/458; 428/36.9; 438/731; 156/345.1
(58) Field of Search ................................ 428/36.9, 35.7, 428/473.5, 458; 264/328.12, 235; 156/345.1; 438/731

(56) References Cited

U.S. PATENT DOCUMENTS

| 5,304,279 A | * | 4/1994 | Coultas et al. ......... 156/345.49 |
| 5,641,375 A | * | 6/1997 | Nitescu et al. ........... 156/345.1 |
| 6,315,456 B1 | * | 11/2001 | Tanimoto et al. ............ 384/527 |

FOREIGN PATENT DOCUMENTS

| WO | WO9626791 A | * | 9/1996 | ............ B05D/3/02 |

* cited by examiner

Primary Examiner—William P. Watkins, III
Assistant Examiner—Jane Rhee

(57) ABSTRACT

A resin molded article for fitting to an inside wall of a liner in a chamber of a dry etching apparatus used in semiconductor manufacture is disclosed. The resin molded article is a seamless annular molded article having a heat resistance temperature of at least 100° C., a tensile elongation at break of at least 0.3%, a flexural modulus of at least 10,000 kg/cm$^2$, an outside diameter from 0 to 0.3% larger than the inside diameter of the liner, and a wall thickness of not more than 2 mm.

6 Claims, 1 Drawing Sheet

RESIN MOLDED ARTICLE FOR CHAMBER LINER

FIELD OF THE INVENTION

The present invention relates to a seamless annular resin molded article for use in a liner within a chamber of a dry etching apparatus used in semiconductor manufacture. More specifically, the invention relates to a resin molded article for a liner, which resin molded article is able to reduce, for an extended period of time, damage to circuits formed on wafers owing to contamination within the liner by heavy metals or reaction products, and the fitting method for which is simple.

BACKGROUND OF THE INVENTION

A dry etching process that uses plasma has been employed recently in semiconductor manufacture. In this plasma dry etching process, a reactive gas is ionized with a plasma, the ionized gas is induced to react chemically with the material to be etched, and the etched material is removed together with the gas. However, the direction of etching has isotropy, which results in wafer contamination by heavy metals due to sputtering and etching of the liner installed within the chamber in the dry etching apparatus. Alumite-treated aluminum liners have been used to prevent this.

Unfortunately, under severe plasma irradiation conditions, the surface layer of alumite detaches in a relatively short time, resulting in wafer contamination by aluminum particles.

Moreover, to prevent the deposition on the wafer of that portion of the reaction products formed by dry etching which is not discharged as gases but remains instead within the liner, a liner having a construction in which the reaction products deposit on the liner inside wall by heating the liner from the outside, maintaining the liner inside wall at a predetermined temperature, and thus controlling agglomeration of the reaction product is used. Yet, it could not be sufficient to adequately prevent contamination of the wafer by the reaction products.

To prevent wafer contamination by aluminum particles and reaction products, there has been developed an alumite-treated aluminum liner coated on the inside wall with a dispersion of a polyimide precursor having excellent plasma resistance. However, the applied coat lacks sufficient durability and plasma resistance, and cannot be thickly applied.

Liners are used with a polyimide film obtained from a polyimide precursor, but their durability and plasma resistance are not sufficient, in addition to which a film thickness greater than 0.25 mm cannot be achieved. Moreover, reaction products deposit locally at seams and deposit excessively even when the temperature of the liner inside wall is controlled, which causes the detachment of deposits, resulting in contamination within the liner. Moreover, the film has a tendency to peel off starting at seams. In addition, since an adhesive is used to fit the film to the inside wall of the liner, replacement of the film cannot be easily carried out.

Hence, a need exists for a resin molded article for liners which is able to reduce, for an extended period of time, damages to circuits formed on wafers due to contamination within the liner by heavy metals and reaction products, and which is easy to fit in place and easy to remove.

In is therefore an object of this invention to provide a resin molded article for a liner, which article has excellent plasma resistance and durability, and is also easy to fit into place and easy to remove.

SUMMARY OF THE INVENTION

We have conducted extensive research to resolve problems such as these. As a result, we have found that damage to the circuits formed on wafers due to contamination within the liner by heavy metals and reaction products can be reduced for an extended period of time by fitting to the inside wall of the liner a seamless (annular or ring-shaped resin molded article having plasma resistance, heat resistance, flexibility, and a predetermined thickness.

Accordingly, a first aspect of the present invention relates to a resin molded article for fitting to an inside wall of a liner in a chamber of a dry etching apparatus used in semiconductor manufacture, wherein the resin molded article is a seamless annular molded article having a heat resistance temperature of at least 100° C., a tensile elongation at break of at least 0.3%, a flexural modulus of at least 10,000 $kg/cm_2$, an outside diameter from 0 to 0.3% larger than the inside diameter of the liner, and a wall thickness of not more than 2 mm.

A second aspect of the invention relates to the above-described resin molded article, wherein the resin molded article is a seamless annular molded article having a heat resistance temperature of at least 100° C., a tensile elongation at break of at least 5%, a flexural modulus within a range of 10,000 to 100,000 $kg/cm^2$, an outside diameter from 0.01 to 0.3% larger than the inside diameter of the liner, and a wall thickness of not more than 2 mm.

A third aspect of this invention relates to a resin molded article for fitting to an inside wall of a liner in a chamber of a dry etching apparatus used in semiconductor fabrication, wherein the resin molded article is a seamless annular molded article which is molded of polyimide resin powder and which has an outside diameter from 0.01 to 0.3% larger than the inside diameter of the liner and a wall thickness of not more than 2 mm.

BRIEF DESCRIPTION OF THE DRAWINGS

The attached figures show a liner used in the invention, a resin molded body according to one embodiment of the invention, and a fitting tool which can be used to fit the resin molded article of the invention to the inside wall of the liner.

DETAILED DESCRIPTION OF THE INVENTION

Figure 1A:
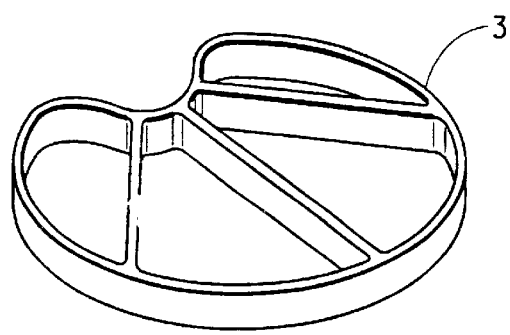
FIG. 1(a) shows the fitting tool 3.
Figure 1B:
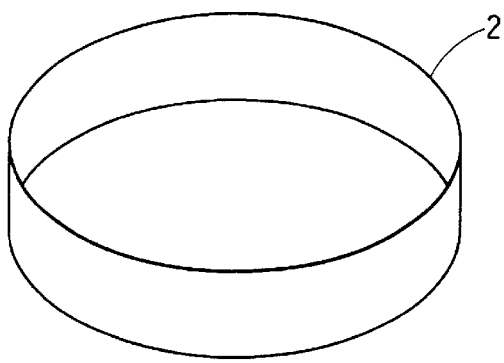
FIG. 1(b) shows the resin molded article 2.
Figure 1C:
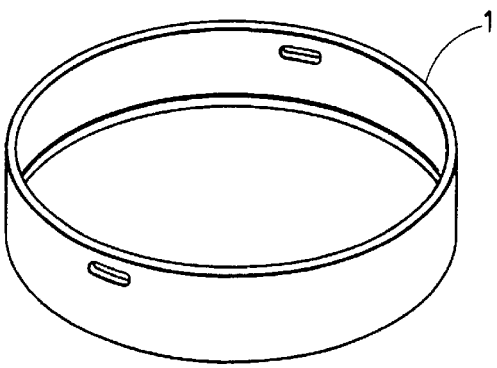
FIG. 1(c) shows the liner.

The invention is described with reference to attached FIG. 1, wherein FIG. 1(a) is a fitting tool 3 which can be used in the invention, FIG. 1(b) is a seamless annular resin molded article 2 according to the present invention, and FIG. 1(c) is a liner 1 used in the invention.

The inventive resin molded article 2 (hereinafter, the reference numerals 1 and 2 are omitted where unnecessary) for a liner is a resin molded article having a heat resistance temperature of at least 100° C., a tensile elongation at break of at least 0.3%, and a flexural modulus of at least 10,000 $kg/cm_2$.

The heat resistance temperature is preferably at least 120° C., and more preferably at least 150° C. If the heat resistance temperature is below 100° C., because the dry etching process temperature locally exceeds 100° C., degassing of the resin molded article due to pyrolysis results in contamination of the liner interior.

The resin molded article is a seamless annular molded article having an outside diameter from 0 to 0.3% larger than the inside diameter of the liner, and having a wall thickness of not more than 2 mm. A resin molded article having an outside diameter more than 0.3% larger than the inside diameter of the liner causes localized stress when fitted in place, which is not desirable.

The wall thickness of the resin molded article is preferably from 0.3 to 1.5 mm, and more preferably from 0.5 to 1.0 mm. At a thickness greater than 2 mm, when the liner is heated from the outside, the resin molded article acts as a heat insulator, making it impossible to keep the inside wall of the liner at the predetermined temperature. As a result, the reaction products cannot be induced to deposit on the inside wall of the liner.

Moreover, it is critical that the resin molded article be a seamless annular molded article. If there is a seam, the reaction products deposit locally at the seam and deposit excessively even when the temperature on the inside wall of the liner is controlled, which causes the detachment of deposits, resulting in contamination within the liner. When the resin molded article is not seamless, detachment of the resin molded article from the seam readily arises.

The resin molded article of the present invention for use in a liner can be fitted into place by heating the aluminum liner to about 100° C., causing it to expand. Alternatively, when the molded resin article has a tensile elongation at break of at least 5%, a flexural modulus within a range of 10,000 to 100,000 kg/cm$^2$, and an outside diameter from 0.01 to 0.3% larger than the inside diameter of the liner, it can be fitted to the inside wall of the liner by applying a load to at least one place from the outer periphery of the resin molded article at ambient temperature and pressure so as to cause the resin molded article to deflect, then releasing the deflection within the liner. In this case, the resin-molded article may also be inserted by press-fitting at ambient temperature and pressure.

In those cases where the resin molded article is deflected and fit into place as described above at ambient temperature and pressure, fitting of the resin molded article 2 can easily be achieved without damage by using the fitting tool 3 shown in FIG. 1(a).

When the resin molded article of the invention is fitted into place at ambient temperature and pressure by making use of its flexibility, the tensile elongation at break is preferably at least 7%, more preferably at least 10%, and the flexural modulus is preferably within a range of 20,000 to 60,000 kg/cm$^2$, more preferably within a range of 20.000 to 40.000 kg/cm$^2$. A resin molded article having an outside diameter less than 0.01% larger than the inside diameter of the liner, when exposed to high heat in a vacuum during dry etching, undergoes dehydration shrinkage and loosens. As a result, fitting cannot be carried out without using an adhesive; that is, by relying only on the flexibility of the molded article. The preferred outside diameter must be decided in accordance with the flexibility of the resin used, within the range of the present invention.

The inventive resin molded article having a heat resistance temperature of at least 100° C., a tensile elongation at break of at least 0.3%, and a flexural modulus of at least 10,000 kg/cm$^2$ is a molded article made of a resin powder, illustrative examples of which include any one, or mixtures of two or more, of the following: polyphenylene sulfide, liquid crystal polymer, polybenzimidazole, polyimide, polyetherimide, polyamideimide, polyetheretherketone, polycarbonate, polyarylate, tetrafluoroethylene/ perfluoroalkylvinyl ether copolymer (PFA), polytetrafluoroethylene (PTFE), polychlorotrifluoroethylene (PCTFE), tetrafluoroethylene/hexafluoropropylene copolymer (FEP), polyvinylidene fluoride (PVDF), ethylene/ tetrafluoroethylene copolymer (ETFE), aromatic polyamide, and polyethersulfone.

To carry out fitting without using an adhesive (that is, by relying solely on the flexibility of the resin molded article), the resin molded article must have a tensile elongation at break of at least 5%, and a flexural modulus within a range of 10,000 to 100,000 kg/cm$^2$. Illustrative examples include molded articles comprised of any one, or mixtures of two or more, of the following resin powders: polyphenylene sulfide, liquid crystal polymer, polyimide, polyetherimide, polyamideimide, polyetheretherketone, polycarbonate, polyarylate, tetrafluoroethylene/perfluoroalkylvinyl ether copolymer (PFA), polytetrafluoroethylene (PTFE), polychlorotrifluoroethylene (PCTFE), tetrafluoroethylene/ hexafluoropropylene copolymer (FEP), polyvinylidene fluoride (PVDF), ethyleneltetrafluoroethylene copolymer (ETFE), aromatic polyamide, and polyethersulfone.

These resin molded articles can be produced by a known molding method suitable for the particular resin powder used. Exemplary molding methods include injection molding and compression molding. Of the above, because polyimide resin powder has a high purity as well as excellent vacuum resistance, high-frequency insulating properties, and antistatic properties, the use of a resin molded article produced by compression molding a polyimide resin powder is preferred.

The resin molded article used in this invention may contain well-known additives which will not become a cause of contamination within the liner. For example, the resin molded article may be obtained by mixing a fluorocarbon resin, molybdenum disulfide or the like with a resin powder, then molding.

EXAMPLE 1

A polyimide resin powder manufactured by Du Pont under the registered trademark "Vespel" SP-1 was loaded into a seamless annular mold and compressed at a compression pressure (area) of at least 40,000 psi and a temperature of at least 350° C., giving a polyimide molded article having a heat resistance temperature of 300° C., a tensile elongation at break of 7%, and a flexural modulus of 30,000 kg/cm$^2$. This molded article was machined to give a resin molded article 2 having a finished wall thickness of about 1 mm and an outside diameter about 0.2% larger than the inside diameter of the liner.

Using a fitting tool 3, the resulting resin molded article 2 was fitted to the inside wall of an alumite-treated aluminum liner 1 at ambient temperature and pressure.

Dry etching was carried out using primarily a fluorine plasma within a liner fitted with the resin molded article 2, as a result of which damage to circuits formed on wafers that is caused by heavy metal and reaction product contamination within the liner was reduced for a period of more than 150 hours.

COMPARATIVE EXAMPLE 1

A polyimide precursor dispersion was applied with a spray gun onto the inside wall of an alumite-treated aluminum liner like that used in Example 1, thereby forming a 10 to 50 μm coat, which was then fired at a temperature of over 350° C. Dry etching was carried out using primarily a fluorine plasma within the resulting liner and under the same conditions as in Example 1, as a result of which damage to circuits formed on wafers that was caused by heavy metal and reaction product contamination within the liner was reduced for a period of about 15 hours.

COMPARATIVE EXAMPLE 2

A polyimide film having a thickness of about 0.25 mm was attached by means of an acrylic adhesive to the inside wall of an alumite-treated aluminum liner like that used in Example 1. Dry etching was carried out using primarily a fluorine plasma within the resulting liner and under the same conditions as in Example 1, as a result of which damage to circuits formed on wafers that was caused by heavy metal and reaction product contamination within the liner was reduced for a period of about 30 hours.

As is apparent from the above results, the seamless annular resin molded articles having distinctive characteristics according to the present invention are able to reduce, for an extended period of time, wafer damage to contamination by heavy metals and reaction products within the liner. Specifically, the resin molded articles of the present invention have been found to achieve a durability at least ten times longer than that of liners provided with a prior-art coating, and about five times longer than that of liners fitted with a film.

What is claimed is:

1. A molded article for fitting to an inside wall of a liner at ambient temperature and pressure, in a chamber of a dry etching apparatus used in semiconductor manufacture, comprising a flexible seamless annular molded article that has (a) a heat resistance temperature of at least 100 degree C.,
   (b) a tensile elongation at break of at least 0.3%,
   (c) a flexural modulus in the range of 10,000 kg/cm$^2$ to 100,000 kg/cm$^2$ at ambient temperature and pressure,
   (d) an outside diameter from 0 to 0.3% larger than the inside diameter of the liner, and
   (e) a wall thickness of not more than 2 mm.

2. A molded article according to claim 1 which has a heat resistance temperature of at least 120° C.

3. A molded article according to claim 1 which has a tensile elongation at break of at least 5%.

4. A molded article according to claim 1 which has a flexural modulus of 20,000–60,000 kg/cm$^2$.

5. A molded article according to claim 1 which has (a) a heat resistance temperature of at least 120° C.,
   (b) a tensile elongation at break of at least S%,
   (c) a flexural modulus of 20,000–60,000 kg/cm$^2$, and
   (d) an outside diameter from 0.01 to 0.3% larger than the inside diameter of the liner.

6. A molded article according to claim 1 wherein the article is molded from polyimide.

* * * * *